(12) United States Patent
Wado et al.

(10) Patent No.: US 6,602,428 B2
(45) Date of Patent: Aug. 5, 2003

(54) METHOD OF MANUFACTURING SENSOR HAVING MEMBRANE STRUCTURE

(75) Inventors: Hiroyuki Wado, Toyota (JP); Makiko Sugiura, Obu (JP); Toshimasa Yamamoto, Bisai (JP); Yukihiro Takeuchi, Nishikamo-gun (JP); Yasushi Kohno, Nagoya (JP)

(73) Assignee: Denso Corporation, Kariya (JP)

( * ) Notice: Subject to any disclaimer, the term of this patent is extended or adjusted under 35 U.S.C. 154(b) by 68 days.

(21) Appl. No.: 09/991,986

(22) Filed: Nov. 26, 2001

(65) Prior Publication Data

US 2002/0070195 A1 Jun. 13, 2002

(30) Foreign Application Priority Data

Dec. 13, 2000 (JP) ........................................ 2000-379119
Jul. 23, 2001 (JP) ........................................ 2001-221695

(51) Int. Cl.$^7$ ............................ H01L 21/00; B44C 1/22; C23F 1/00
(52) U.S. Cl. ................ 216/2; 216/13; 216/41; 216/55; 216/66; 216/75; 438/713; 438/714; 438/715; 438/720; 438/742; 438/745
(58) Field of Search .................................. 216/2, 11, 13, 216/16, 20, 33, 41, 55, 57, 66, 75; 438/712, 713, 714, 715, 720, 723, 724, 742, 743, 744, 756, 757

(56) References Cited

FOREIGN PATENT DOCUMENTS

JP  A-10-260069  9/1998

*Primary Examiner*—William A. Powell
(74) *Attorney, Agent, or Firm*—Posz & Bethards, PLC

(57) ABSTRACT

A sensor for measuring a physical amount such as an amount of air includes a membrane structure composed of metal stripes sandwiched between first and second insulating layers. A metal layer made of platinum or the like is formed on the first insulating layer and then heat-treated to improve its properties. Then, the metal layer is etched into a form of the metal stripes. The second insulating layer made of a material such as silicon dioxide is formed on the etched metal stripes. Since the metal layer is heat-treated before it is etched into the form of metal stripes, the metal stripes are not deformed by the heat-treatment. The second insulating layer can be formed on the metal stripes without generating cracks in the second insulating layer.

25 Claims, 9 Drawing Sheets

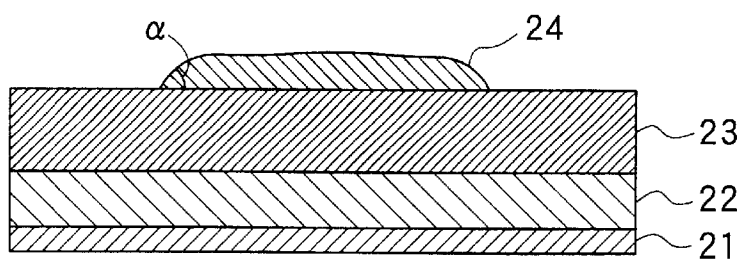
FIG. 2A
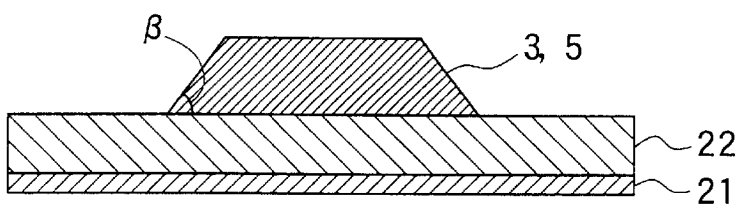
FIG. 2B
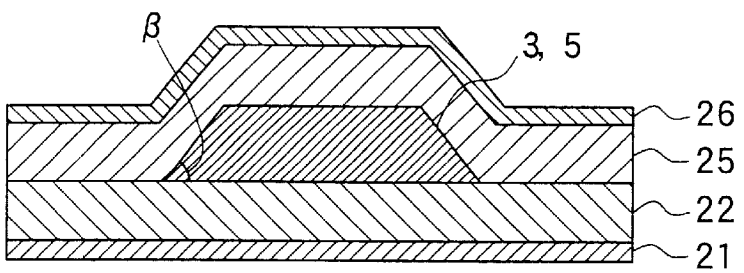
FIG. 2C
FIG. 3
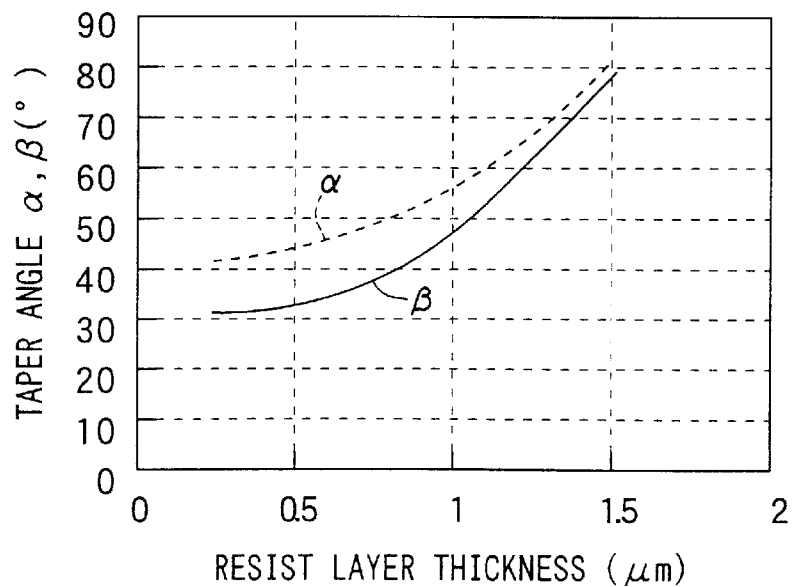

METHOD OF MANUFACTURING SENSOR HAVING MEMBRANE STRUCTURE

CROSS-REFERENCE TO RELATED APPLICATIONS

This application is based upon and claims benefit of priority of Japanese Patent Applications No. 2000-379119 filed on Dec. 13, 2000 and No. 2001-221695 filed on Jul. 23, 2001, the contents of which are incorporated herein by reference.

BACKGROUND OF THE INVENTION

1. Field of the Invention

The present invention relates to a method of manufacturing a sensor having a membrane structure. The sensor is used, for example, for measuring an amount of air supplied to an internal combustion engine.

2. Description of Related Art

A sensor having a membrane structure that includes metal stripes is known hitherto. Such sensor measures a physical amount based on physical property changes of the metal stripes. For example, a heat-sensitive airflow sensor having metal stripes made of platinum or the like measures an amount of air supplied to an internal combustion engine. An amount of heat radiated by an airflow is detected by the metal stripes, and the amount of air is measured based on the detected amount of radiated heat.

An example of a conventional airflow sensor having such a membrane structure will be briefly explained in reference to FIGS. 7A–7C. The membrane structure of the conventional airflow sensor is formed in a process shown in FIGS. 7A–7C. As shown in FIG. 7A, a first insulating layer 101 is formed on a substrate (not shown), and then a metal layer 102, e.g., 0.2 μm thick, is formed on the first insulating layer 101. Then, a resist layer 103 having about 1 μm thickness is formed on the metal layer 102. Then, as shown in FIG. 7B, the metal layer 102 is patterned into metal stripes 104 having a desired form in an etching process such as ion-milling, using the resist layer 103 as a mask. Then, a heat-treatment such as annealing is performed to improve properties of the metal stripes 104. By the heat-treatment, a temperature coefficient of resistance (TCR) of the metal stripes 104 is raised thereby to improve a temperature sensitivity of the metal stripes 104.

Then, as shown in FIG. 7C, a second insulating layer 105 is formed to cover the metal stripes 104. Then, a cavity is formed from a bottom of the substrate at a position corresponding to the metal stripes 104 and its vicinity. Thus, a membrane structure having the insulation layers 101, 105 and the metal stripes 104 is formed.

Since a taper angle θ1 (shown in FIG. 7A) formed between the upper surface of the metal layer 102 and an end slope of the resist layer 103 is large (about 80 degrees), a taper angle θ2 (shown in FIGS. 7B and 7C) formed between the upper surface of the first insulating layer 101 and an end slope of the metal stripe 104 also becomes large, because the taper angle θ2 is influenced by the taper angle θ1 in the etching process. As a result, as shown in FIG. 7C, cracks 105a are developed at stepped corners of the second insulating layer 105 in the process of forming the second insulating layer 105. The mechanical strength of the membrane structure is reduced by the cracks 105a. Therefore, there is a possibility that the membrane structure is broken down by a heat stress generated by on-and-off operation of the airflow sensor, because a thermal expansion coefficient of the insulating layers 101, 105 is different from that of the metal stripes 104.

To prevent development of the cracks 105a, it would be effective to reduce the taper angle θ1 thereby to reduce the taper angle θ2. For this purpose, a process shown in FIGS. 8A and 8B is conceived. In the process shown in FIG. 8A, a thinner resist layer 106 is coated and the resist layer is smoothened by performing post-baking, thereby making the taper angle θ1 smaller. Using the resist layer 106 having a smaller taper angle θ1 as a mask, the metal layer 102 is etched into a form of the metal stripes 104. In this manner, the metal stripes 104 having smaller taper angle θ2 can be formed as shown in FIG. 8B. It may be also possible to make the taper angle θ2 smaller by supplying etching gas in a direction slanted from a line perpendicular to the upper surface of the metal layer 102, even a resist layer having a large taper angle θ1 is used as a mask.

However, even if the metal stripes 104 having a small taper angle θ2 is formed by etching, the taper angle θ2 is increased by heat-treatment performed after the etching process to improve the properties of the metal stripes 104. This is because a grain size in the metal stripes 104 is increased in the heat-treatment process. Because the grain size is also enlarged at a tip of the tapered portion, the taper angle θ2 is increased accordingly. As a result, cracks 105a develop due to the large taper angle θ2. To confirm the crack development, tests were carried out. As test samples, the metal stripes having various taper angles θ2 in a range 32–72 degrees were made. Such metal stripes were heat-treated after they were formed, and whether the cracks developed or not were observed. The cracks 105a were found in all the samples.

Further, there is a possibility that electric-filed concentrates at end portions of the metal stripes 104 in the etching process of the metal layer 102, and thereby the first insulating layer 101 is over-etched, forming steps 101a as shown in FIG. 9. When the second insulating layer 105 is formed on the over-etched steps 101a, there is a possibility that the cracks 105a develop at the steps 101a as shown in FIG. 9.

In a conventional membrane structure in which the metal layer 102 is composed of tow layers, there is a following problem. FIGS. 16A–16D briefly show a manufacturing process of such a membrane structure. As shown in FIG. 16A, a first insulating layer 101 and a metal layer 102 composed of a titanium (Ti) contact layer 102a and a platinum (Pt) layer 102b are formed on a substrate (not shown). Then, as shown in FIG. 16B, the metal layer 102 is annealed and a resist layer 103 is formed on the metal layer 102. In the annealing process, titanium grains 102a are dispersed into the platinum layer 102b.

Then, as shown in FIG. 16C, the metal layer 102 is etched by ion-milling, using the resist layer 103 as a mask, to form metal stripes 104. In the etching process, the first insulating layer 101 is over-etched, thereby forming steps 101a and forming a large taper angle θ2 at the tip of the metal stripe 104. Further, titanium grains 102a are left over on the tapered surface because a milling speed of titanium is slower than that of platinum. Also, residual spots 101b are formed on the surface of the first insulating layer 101 because the shape of the titanium grains 102a is projected on the surface where the titanium grains exist in the platinum layer 102b.

Then, a second insulating layer 105 is formed to cover the metal stripes 104, as shown in FIG. 16D. Cracks 105a and voids 105b develop in the second insulating layer 105 due to presence of the titanium grains 102a on the tapered surface and the steps 101a on the surface of the first insulating layer

101. Further, due to the residual spots 101*b*, projections are formed on the surface of the second insulating layer 105. The mechanical strength of the membrane structure is considerably reduced by the cracks 105*a*, voids 105*b* and projections.

SUMMARY OF THE INVENTION

The present invention has been made in view of the above-mentioned problems, and an object of the present invention is to provide a manufacturing method of a sensor device, in which a mechanical strength of a membrane structure is improved by preventing development of cracks in an insulating layer.

A membrane structure composed of thin film layers is formed on a part of a substrate such as a silicon substrate. The membrane structure includes a first insulating layer, a second insulating layer and metal stripes formed between both insulating layers. The metal stripes are formed by etching a metal layer disposed between both insulating layers. Electrical resistance of the metal stripes changes according to temperature, and the resistance changes are used to detect physical amounts such as an amount of air flowing through the metal stripes.

The membrane structure is manufactured as follows. The first insulating layer made of a material such as silicon oxide is formed on the substrate. The metal layer made of a material such as platinum is formed on the first insulating layer. The metal layer is heat-treated to enlarge its grain size and to increase its temperature coefficient of resistance. The heat-treated metal layer is etched into a form of the metal stripes using a resist layer formed on the metal layer as an etching mask. Then, the second insulating layer made of a material such as silicon oxide is formed to cover the metal stripes.

Since the heat-treatment of the metal layer is performed before the etching process, an end-portion taper angle of the metal stripes is not increased by the heat-treatment. Therefore, the second insulating layer can be formed on the metal stripes without generating cracks therein.

In the process of etching the metal layer, a thin resist layer is formed on the metal layer, and the resist layer is post-baked at a relatively high temperature to flatten its surface and thereby to decrease its end-potion taper angle. Using the resist layer as an etching mask, the metal layer is etched so that the taper angle of the metal stripes becomes smaller than 65 degrees. The etching may be performed under an ion-milling process using argon gas. In order to prevent the first insulating layer from being over-etched in the process of etching the metal layer, an etching-stopper layer made of a material such as titanium may be additionally formed underneath the metal layer to cover the first insulating layer.

The metal layer in the membrane structure may be composed of a double layer that includes a first metal layer made of a metal such as titanium and a second metal layer made of a metal such as platinum. The first metal layer functions as a contact layer disposed between the first insulating layer and the second metal layer to improve their close contact. The metal layer composed of the double-layer is etched so that both metals, e.g., platinum and titanium, are etched at a substantially same etching rate in order to obtain a smooth tapered end-surface of the metal stripes.

The metal layer composed of the double layer may be etched under an ion-milling process, in which an ion-incident angle upon the metal layer is set to an angle slanted from a normal line of the metal layer surface, and the metal layer is rotated around the normal line during the etching process. The ion-incident angle is preferably set to 20–60 degrees to effectively suppress formation of etched steps on the first insulating layer. In this manner, the metal stripes having smooth tapered end surfaces are formed, and the steps on the first insulating layer are suppressed. Therefore, the second insulating layer is formed on the metal stripes without generating cracks in the second insulating layer.

It is also possible to perform an additional etching for removing residual spots formed on the surface of the first insulating layer. By additionally etching the surface of the first insulating layer in an amount of 30% of the metal layer thickness, the residual spots on the first insulating layer is effectively removed. Thus, the second insulating layer is formed on the smoothened surface of the first insulating layer, and thereby formation of the cracks in the second insulating layer is avoided.

According to the present invention, formation of the cracks in the second insulating layer is prevented, and thereby the membrane structure having a sufficient mechanical strength is manufactured.

Other objects and features of the present invention will become more readily apparent from a better understanding of the preferred embodiments described below with reference to the following drawings.

BRIEF DESCRIPTION OF THE DRAWINGS

FIGS. 2A–2C are cross-sectional views of the membrane structure, taken along line II—II in FIG. 1, showing a manufacturing process thereof;

FIG. 3 is a graph showing taper angles of a resist layer and a metal stripe relative to a resist layer thickness;

DETAILED DESCRIPTION OF THE PREFERRED EMBODIMENTS

A first embodiment of the present invention will be described with reference to FIGS. 1–4B. First, referring to FIG. 1, an entire structure of a sensor S1, which is used as a heat-responsive airflow sensor for measuring an amount of air supplied to an internal combustion engine, will be described. A cavity 6 is formed from a rear surface of a substrate 1 made of silicon or the like, and a membrane structure 10 having sensor elements is formed on the front surface of the substrate 1 at an area corresponding to the cavity 6. Cross-sectional views of the membrane structure 10 are shown in FIGS. 2A–2C.

Figure 1:
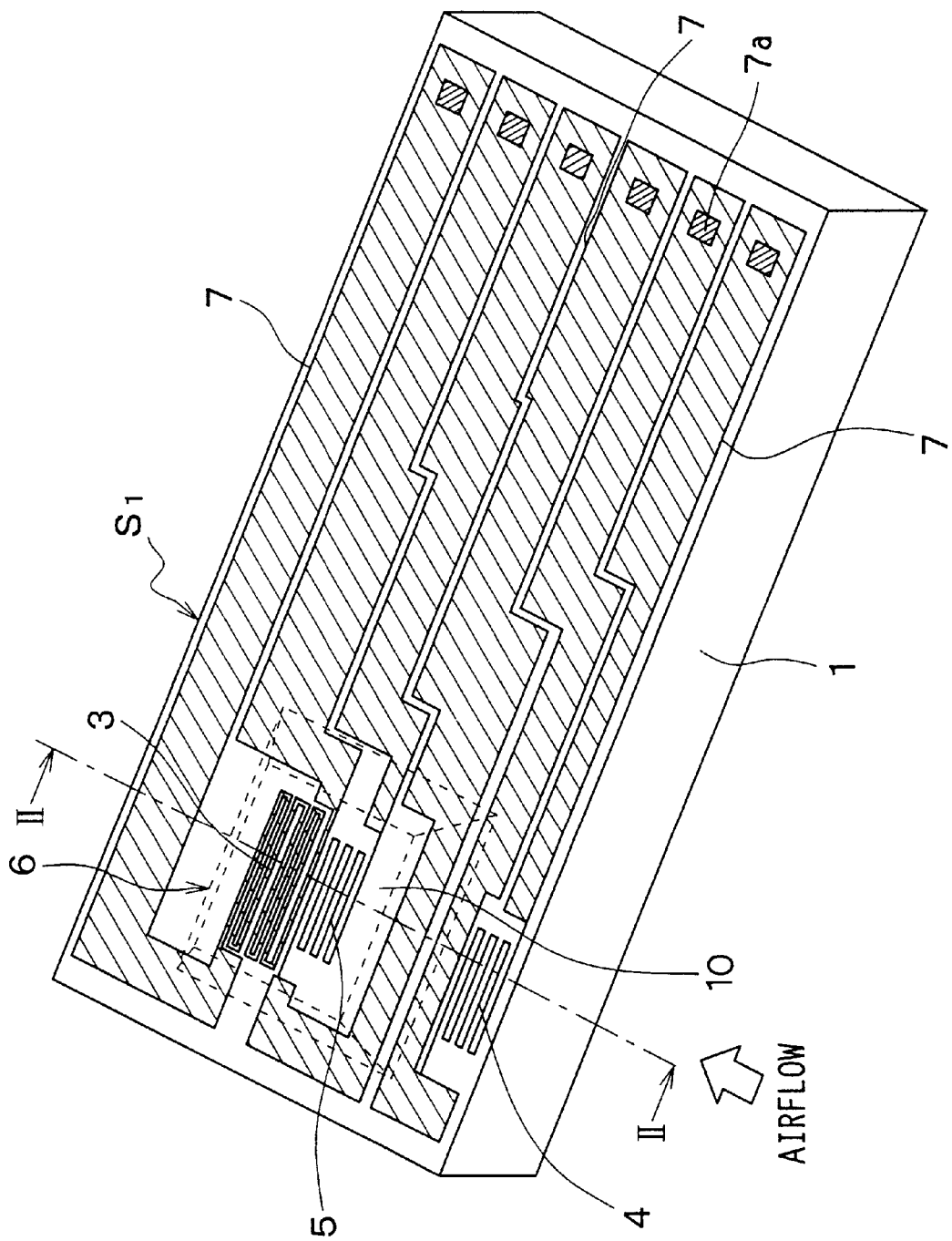
FIG. 1 is a perspective view showing a structure of an airflow sensor as a first embodiment of the present invention.

As shown in FIG. 1, the membrane structure 10 includes a heater 3 and a temperature detector 5 positioned next to the heater 3. The heater 3 and the temperature detector 5 are made of metal stripes in a zigzag shape. A thermometer 4 for measuring air temperature is formed on the front surface of the substrate 1 at a position separated from the membrane structure 10. The thermometer 4 is also made of metal stripes in a zigzag shape. Connecting leads 7 electrically connected to the heater 3, the temperature detector 5 and the thermometer 4, respectively, are formed on the front surface of the substrate 1. At the respective ends of the connecting leads 7, terminal pads 7a for electrically connecting sensor outputs to outside circuits are formed. In this embodiment, the heater 3, the temperature detector 5 and the thermometer 4 are all made of platinum (Pt).

The airflow sensor S1 is placed in an airflow, the direction of which is shown by an arrow in FIG. 1. The airflow first hits the thermometer 4 and then the temperature detector 5 and the heater 3. A temperature of the heater 3 is controlled to a temperature level which is higher, by a predetermined amount, than airflow temperature measured by the thermometer 4. The temperature detector 5 positioned next to the heater 3 is cooled down by the airflow when air is supplied in a forward direction shown by the arrow, while it is heated by the heater 3 when air is supplied in a reverse direction opposite to the arrow. A direction of the airflow and an amount of air flowing through the sensor S1 are detected based on a temperature difference between the temperature detected by the temperature detector 5 and the temperature measured by the thermometer 4. The temperature detector 5 and the thermometer 4 detect such temperature based on changes in electrically resistances of their metal stripes.

A manufacturing method of the airflow sensor S1 will be described with reference to FIGS. 2A–2C showing the cross-sectional structure of the membrane 10. As shown in FIG. 2A, a bottom insulating layer 21 made of silicon nitride (such as $Si_3N_4$) is formed on the substrate 1 (not shown) by a method such as thermal CVD. The bottom insulating layer 21 is made 0.13 μm thick at 780° C., for example. Then, a first insulating layer 22 made of silicon dioxide is formed on the bottom insulating layer 21 by, e.g., a plasma CVD. The first insulating layer 22 is made 0.5 μm thick at 300° C. The bottom insulating layer 21 and the first insulating layer 22 form a double-layer structure in which internal stress is alleviated by combining compressive and expansive stresses.

Then, a metal layer 23 made of platinum is formed on the first insulating layer 22 by a vacuum deposition method, for example. The metal layer 23 is made 0.25 μm thick at 200° C. Then, heat-treatment (annealing) is performed to enlarge a platinum grain size in the metal layer 23. Preferably, the heat-treatment is performed at 780° C., which is higher than a temperature at which the airflow sensor S1 is used, for about 20 hours. A temperature coefficient of resistance (TCR) in the platinum layer 23 is properly increased by this heat-treatment, and thereby a sensitivity of the airflow sensor S1 is improved.

Then, as shown in FIG. 2A, a resist layer 24 is coated on the metal layer 23, so that the heater 3, the thermometer 4, the temperature detector 5 and the connecting leads 7 are patterned according to a pattern of the resist layer 24. The resist layer 24 is coated in a thickness less than 1.3 μm, details of which will be further explained later. Then, a post-baking is performed at a temperature higher than a usual post-baking temperature. Preferably, the post-baking is performed at a temperature in a range 140–180° C. for about 30 minutes. By the post-baking, the resist layer 24 is partially liquefied and flattened, making a resist taper angle α (an angle between an upper surface of the metal layer 23 and an end slope of the resist layer 24, shown in FIG. 2A) smaller. The post-baking is performed at a temperature lower than 180° C. because the resist layer 24 is hardened at a temperature higher than 180° C. and becomes difficult to be removed.

As shown in FIG. 2B, the metal layer 23 is etched into a form of metal stripes (which form the heater 3 and the temperature detector 5), using the resist layer 24 as a mask. The etching may be performed under an ion-milling method using argon gas. A metal stripe taper angle β (an angle between an upper surface of the first insulating layer 22 and a tapered end slope of the metal stripe 3, 5, shown in FIG. 2B) can be made smaller than 65 degrees in this process. The taper angle β will be discussed later in detail. Under this etching process, all the elements, not only the heater 3 and the temperature detector 5 but also the thermometer 4 and the connecting leads 7, are patterned into respective forms.

Then, as shown in FIG. 2C, a second insulating layer 25 made of silicon dioxide is formed on the metal stripes 3, 5. The second insulating layer 25 is formed, for example, by a plasma CVD method at 300° C., making its thickness 0.5 μm. Then, a top insulating layer 26 made of silicon nitride such as $Si_3N_4$ is formed on the second insulating layer 25. The top insulating layer 26 is formed, for example, by a thermal CVD method at 780° C., making its thickness 0.13 μm. The second insulating layer 25 and the top insulating layer 26 are formed to cover also the connecting leads 7 and the thermometer 4. A part of the second insulating layer 25 and the top insulating layer 26 is removed to expose the terminal pads 7a, as shown in FIG. 1, and the exposed pads 7a are covered with gold (Au).

Then, a silicon nitride layer formed on the rear surface of the substrate 1 is partially etched off to expose the rear surface corresponding to the cavity 6. Other portions are covered and protected by the silicon nitride, silicon dioxide or gold layer, which are resistive to TMAH solution. Then, the cavity 6 is formed by anisotropic etching, using TMAH solution. Thus, the airflow sensor S1 having the membrane structure 10 is completed.

Since the heat-treatment for enlarging the platinum grain size is performed before the etching process for forming the metal stripes 3, 5, as described above, the taper angle β of the metal stripes is prevented from growing large. Since the second insulating layer 25 is formed on the metal layer 23 having a small taper angle β, the cracks do not develop in the second insulating layer 25. As a result, the membrane structure 10 having a high mechanical strength is formed. It is very important to secure a high mechanical strength of the membrane structure 10 in sensors such as the airflow sensors that are used in severe environmental conditions.

Influence of the taper angle β of the metal stripes 3, 5 on development of the cracks in the second insulating layer 25 is investigated in detail. The membrane structures 10 having the metal stripes 3, 5 that have various taper angles β, 32, 42, 56, 65 and 72 degrees, are made as test samples. Those samples are made without performing the heat-treatment after the process of etching the metal stripes 3, 5. Then, whether the cracks developed or not was observed. The membrane structure 10 is cutoff along its thickness direction, and the second insulating layer 25 is partially etched off on the cutoff surface. If there are the cracks, a higher amount of the second insulating layer 25 is etched off. The cracks are detected in this manner.

The cracks are found in the membrane structures having taper angle β of 72 degrees, while no cracks are found in the membrane structures having the taper angle β equal to or less than 65 degrees.

Further, an influence of the thickness of the resist layer 24 on the taper angles α and β is investigated. FIG. 3 shows the taper angles α and β relative to the resist thickness. As shown in FIG. 3, the resist taper angle α becomes smaller as the resist layer 24 becomes thinner. This is because when the resist layer 24 is thinner the resist layer 24 is more flattened, making its taper angle α smaller, in the post-baking process which partially liquefies the resist layer 24. The taper angle β of the metal stripes 3, 5 becomes smaller as the taper angle α of the resist layer 24 becomes smaller. Since no crack develops when the taper angle β is equal to or smaller than 65 degrees, as mentioned above, it is concluded that the crack development can be prevented if the resist layer 24 is thinner than 1.35 μm according to the graph shown in FIG. 3. In a particular sample, the taper angle β of the metal stripes 3, 5 becomes 40 degrees when the thickness of the resist layer 24 is 0.6 μm.

On the other hand, if the resist layer is too thin, it does not properly function as a mask for etching. Accordingly, it is necessary to make the resist layer thickness 0.2 μm or thicker. More particularly, when the etching is performed by the ion-milling method using argon gas under an etching rate ratio γ=2 (γ=Pt-etching rate/resist-etching rate), it is desirable that the resist thickness is larger than (0.2 μm+Pt-thickness/γ). Because the Pt-thickness (the thickness of the metal layer 23) is 0.25 μm in the foregoing embodiment, it is desirable that the resist thickness is larger than 0.3 μm.

Figure 4A:
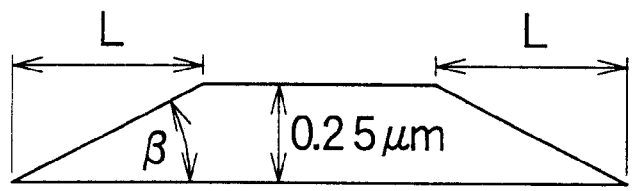
FIG. 4A is a schematic view showing a shape of a metal stripe.
Figure 4B:
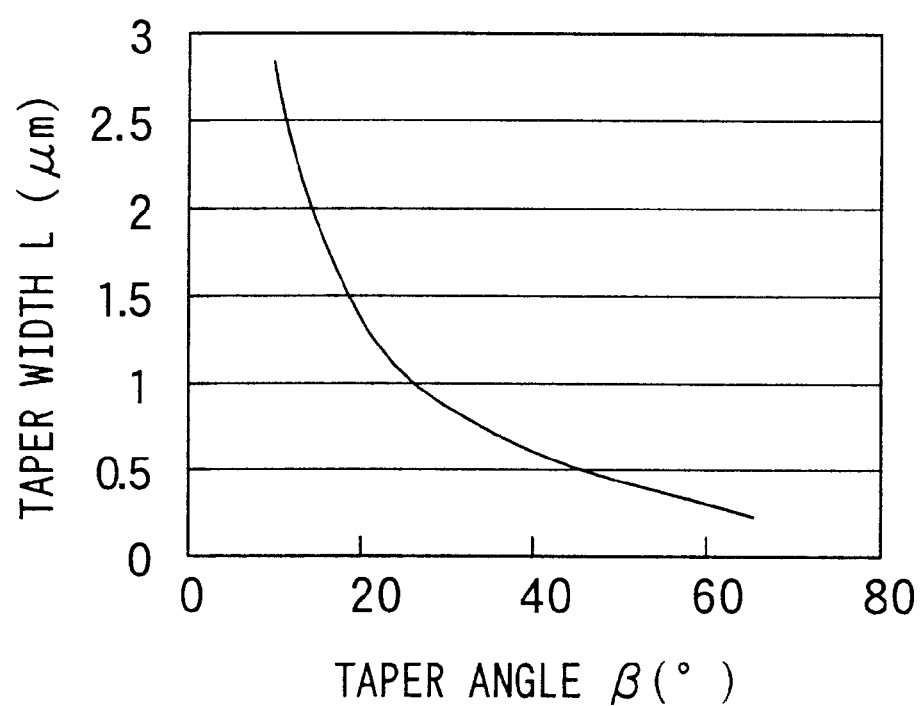
FIG. 4B is a graph showing a relation between a taper angle of the metal stripe and its taper width.

Further, it is desirable not to make the metal layer taper angle β too small. As shown in FIG. 4A, a taper width L depends on the taper angle β and the metal layer thickness (L=metal layer thickness/tan β). As shown in FIG. 4B (showing a relation between β and L when the metal layer thickness is 0.25 μm), if the taper angle β is smaller than 20 degrees, the taper width L is highly influenced by a fluctuation of the taper angle β. Therefore, it is desirable not to make the taper angle β smaller than 20 degrees. Incidentally, the cracks, if any, develop only in the second insulating layer 25, and the cracks do not develop in the top insulating layer 26 made of silicon nitride by the thermal CVD.

As described above, the metal layer 23 is heat-treated to enlarge its metal grain size and to increase its TCR. Since the heat-treatment is performed, according to the present invention, before the metal layer 23 is etched into the metal stripes, the taper angle β of the metal stripes is not increased by the heat-treatment. The cracks are prevented from being developed in the second insulating layer 25. Therefore, the membrane structure 10 having a high mechanical strength can be realized.

Generally, a metal grain size of a poly-crystalline metal is enlarged by heat-treatment, and it is difficult to etch the metal layer having a too large grain size into a precise pattern. However, since the precise etching of less than 1 μm precision is not required in forming the metal stripes 3, 5 in the membrane structure 10, the problem due to the too large grain size is almost negligible. Further, since the cracks, if any, develop only in the second insulating layer 25 covering the metal stripes 3, 5, there occurs no problem if the membrane structure 10 is heat-treated after the second insulating layer 25 is successfully formed.

Figure 5A:
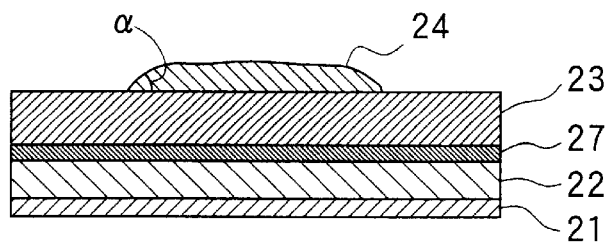
FIGS. 5A–5C are cross-sectional views of a membrane structure of an airflow sensor, showing its manufacturing process as a second embodiment of the present invention.
Figure 5B:
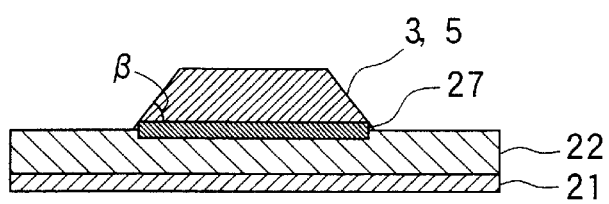
Figure 5C:
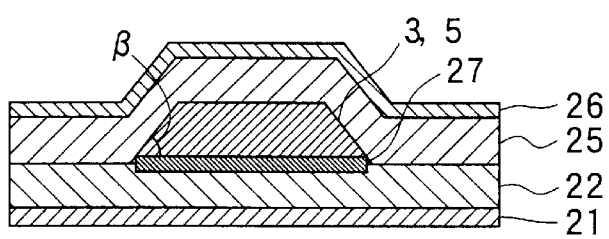

A second embodiment of the present invention will be described with reference to FIGS. 5A–5C. In this embodiment, an etching-stopper metal layer 27 is additionally formed between the first insulating layer 22 and the metal layer 23. Other structures are the same as those in the first embodiment. The etching-stopper metal layer 27 is made of a metal such as titanium (Ti) having a lower etching rate than the metal layer 23. The etching-stopper metal layer 27 is formed in a thickness of, e.g., 20 nm. All the layers shown in FIG. 5A are formed in the same manner as in the first embodiment. The metal layer 23 is heat-treated, and then etched into the form of metal stripes 3, 5 as shown in FIG. 5B. The resist layer 24 is used as an etching mask in the same manner as in the first embodiment.

In the etching process, the etching-stopper layer 27 stops the etching thereby to prevent the first insulating layer 22 from being over-etched. After the etching process, the etching-stopper metal layer 27 remaining on the surface of the first insulating layer 22 is removed by diluted hydrofluoric acid. Then, as shown in FIG. 5C, the second insulating layer 25 is formed to cover the metal stripes 3, 5, and the top insulating layer 26 is formed in the same manner as in the first embodiment.

The etching-stopper metal layer 27 prevents formation of the steps by electric-field concentration at the end portions of the metal stripes 3, 5. Accordingly, development of the cracks in the second insulating layer 25 due to the steps are avoided. The etching-stopper metal layer 27 remaining on the surface of the first insulating layer 22 after the etching may not be necessarily removed.

The remaining layer may be oxidized by oxygen plasma, forming titanium oxide. The etching-stopper metal layer 27 made of titanium also severs to enhance a connecting force between the first insulating layer 22 and the metal layer 23.

Figure 6A:
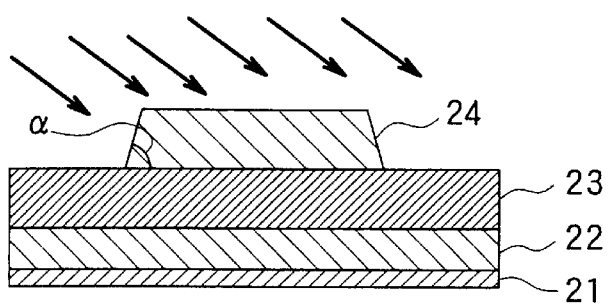
FIGS. 6A–6B are cross-sectional views of a membrane structure, showing its manufacturing process as a third embodiment of the present invention.
Figure 6B:
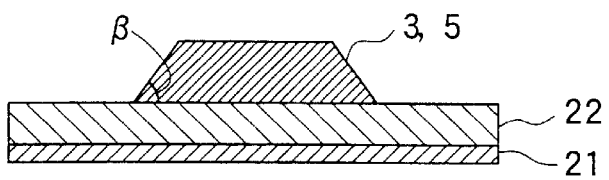
Figure 7A:
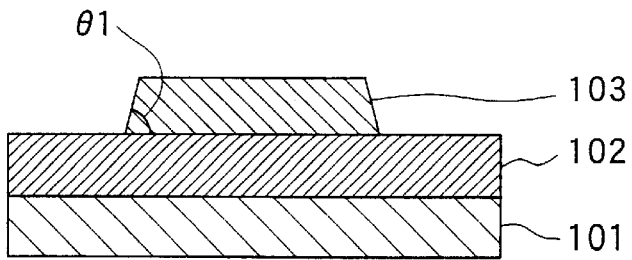
FIGS. 7A–7C are cross-sectional views of a membrane structure of an air flow sensor, showing its conventional manufacturing process.
Figure 7B:
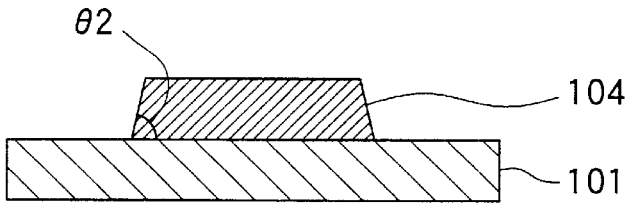
Figure 7C:
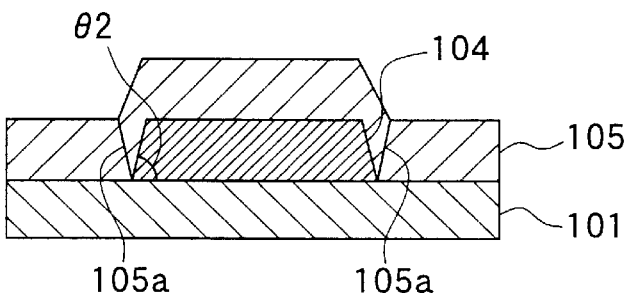
Figure 8A:
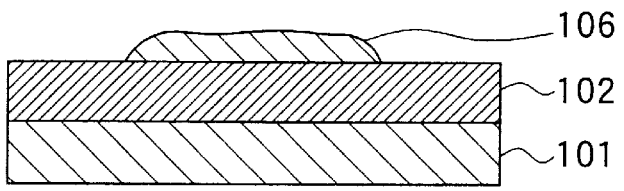
FIGS. 8A and 8B are cross-sectional views of a membrane structure, showing a taper angle of a metal stripe made by reducing a taper angle of a resist layer.
Figure 8B:
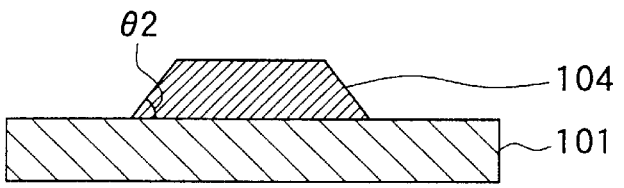
Figure 9:
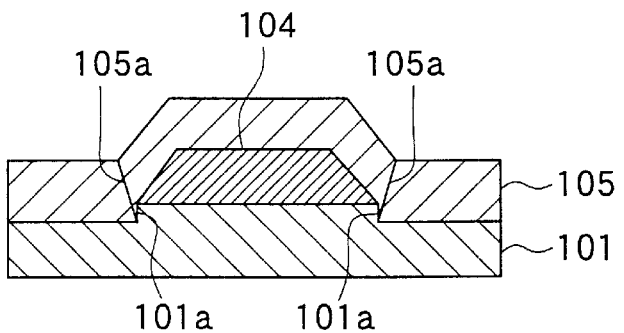
FIG. 9 is a cross-sectional view showing a membrane structure made by a conventional manufacturing method.

A third embodiment of the present invention will be described with reference to FIGS. 6A and 6B. Though the taper angle β of the metal stripes 3, 5 is made smaller by making the taper angle α of the resist layer 24 smaller in the foregoing embodiments, it is also possible to make the taper angle β smaller by supplying etching gas in a direction slanted from a normal line perpendicular to the surface of the metal layer 23. In this embodiment, it is not necessary to make the taper angle α of the resist layer 24 small. The etching gas is supplied in the slanted direction shown in FIG. 6A, and the metal layer 23 is rotated around a center normal line which is perpendicular to the surface of the metal layer 23. In this manner, the taper angle β of the metal stripes 3, 5 can be made small, as shown in FIG. 6B.

Further, it would be possible to make the taper angle β small by performing wet-etching using aqua regina.

However, there is a problem in the wet-etching that a metal grain shape is reflected on the pattern formed by the etching because an etching speed is high at metal grain boundaries. Therefore, it is difficult to precisely pattern the metal stripes. Further, because a resistivity of the resist layer 24 against the aqua regia is low, there is a possibility that the aqua regia enters into the boundary between the resist layer 24 and the metal layer 23, and etching proceeds from the boundary.

In the foregoing embodiments, the metal layer 23 is made 0.25 μm thick, and the second insulating layer 25 is made 0.5 μm thick. When the second insulating layer 25 is made thicker than the metal layer 23 as in the foregoing embodiments, the cracks do not develop in the second insulating layer 25 even if heat-treatment is performed after the second insulating layer 25 is formed. The heat-treatment performed before the etching process in the present invention means the heat-treatment for enlarging the metal grain and to increase the TCR of the metal layer 23. Such heat-treatment may be performed at a temperature higher than 300° C., though it is performed at 780° C. in the foregoing embodiment. The metal layer 23 may be made of a metal other than platinum. It may be made of Pt-alloy, NiCr, TaN, W or the like. The first and the second insulating layers 21, 25 may be made of a material other than silicon dioxide.

Figure 10:
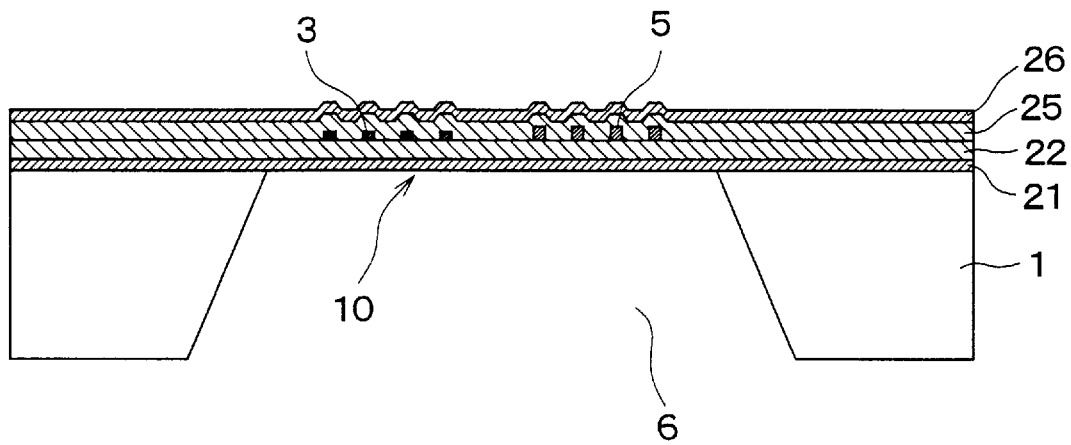
FIG. 10 is a cross-sectional view of a membrane structure of a sensor as a fourth embodiment of the present invention.

A fourth embodiment of the present invention will be described with reference to FIGS. 10 and 11. FIG. 10 shows a cross-sectional view of the membrane structure 10, taken along line II—II in FIG. 1. In this embodiment, the metal layer 23 is composed of a titanium contact layer (Ti-contact layer) and a platinum layer (Pt-layer). The Ti-layer is formed in contact with the first insulating layer 22, and the Pt-layer is formed on the Ti-layer. Other structures are the same as those of the first embodiment described above. The membrane structure 10 of this embodiment is manufactured in the similar manner as described with reference to FIGS. 2A–2C.

The metal layer 23 having a double-layer structure is heat-treated after it is formed and before the etching process. The heat-treatment is performed to enlarge the grain size of Pt and Ti, and to increase their TCR. After the metal layer 23 is heat-treated, the metal layer 23 is etched to the shape of metal stripes 3, 5, using the resist layer 24 as a mask. The etching is performed under the ion-milling method. The etching ion is incident in a direction slanted from a normal line which is perpendicular to the surface of the metal layer 23. The metal layer 23 is rotated around the normal line during the etching process. The ion-incident angle (an angle between the normal line and the direction of the ion supply) is selected so that an etching rate difference between the Pt-layer and the Ti-layer is sufficiently small. The selection of the ion-incident angle will be explained later in detail.

After the metal layer 23 is etched into the form of the metal stripes 3, 5, the second insulating layer 25 and the top insulating layer 26 are formed in the same manner as in the first embodiment. Then, the cavity 6 and the connecting pads 7a are formed in the same manner as in the first embodiment.

Figure 11:
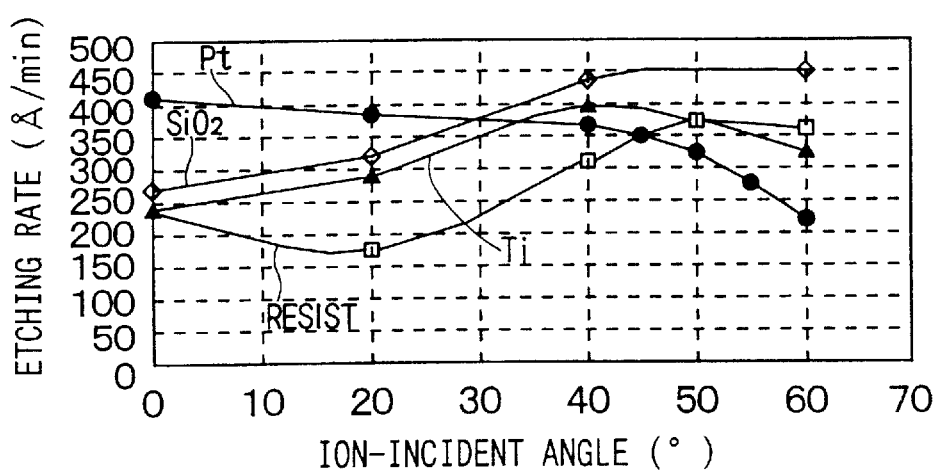
FIG. 11 is a graph showing a relation between an ion-incident angle and an etching rate.

FIG. 11 shows etching rates of the Pt-layer, the Ti-layer, the resist layer 24 and the silicon oxide layer in relation to the ion-incident angle. Both etching rates of Ti and Pt vary according to the ion-incident angle. In the fourth embodiment, the ion-incident angle is set in a range of 20–60 degrees. In this range, the difference between both etching rates is sufficiently small in a practical sense. By setting the ion-incident angle in this range, the Pt-layer and the Ti-layer are evenly etched, and thereby formation of Ti-grains exposing on the tapered surface of the metal stripes 3, 5 is prevented. Accordingly, the tapered surface becomes smooth and the cracks do not develop in the second insulating layer 25 covering the metal stripes 3, 5.

Further, the milling ion is incident upon the metal layer 23 in the slanted direction and the metal layer 23 is rotated around its normal line, harmful steps are not formed on the first insulating layer 22 at the edges of the metal stripes 3, 5. This contributes to decreasing the taper angle β of the metal stripes 3, 5. Accordingly, formation of cracks in the second insulating layer 25 is prevented, thereby increasing the mechanical strength of the membrane structure 10.

A fifth embodiment of the present invention will be described with reference to FIGS. 12A–13. In this embodiment, the metal layer 23 composed of the Pt-layer and the Ti-layer is etched by the ion-milling, in which the ion is incident upon the metal layer 23 in the direction parallel to the normal line of the metal layer surface. After the metal layer 23 is etched into the form of the metal stripes 3, 5, an additional etching for removing residual spots remaining on the surface of the first insulating layer 22 is performed.

Other manufacturing steps are the same as those of the fourth embodiment.

Figure 12A:
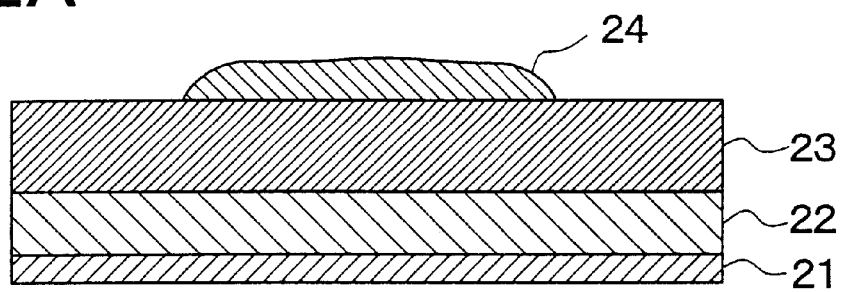
FIGS. 12A–12D are cross-sectional views of a membrane structure, showing its manufacturing method as a fifth embodiment of the present invention.
Figure 12B:
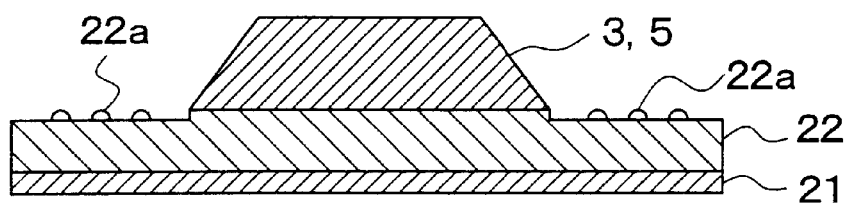
Figure 12C:
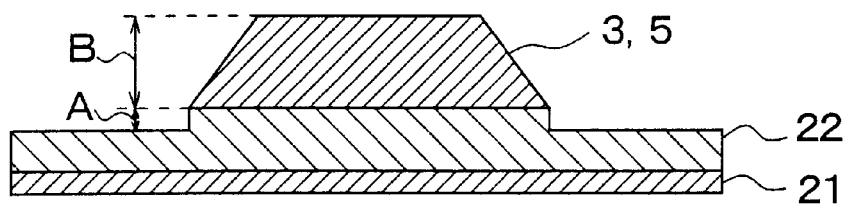
Figure 12D:
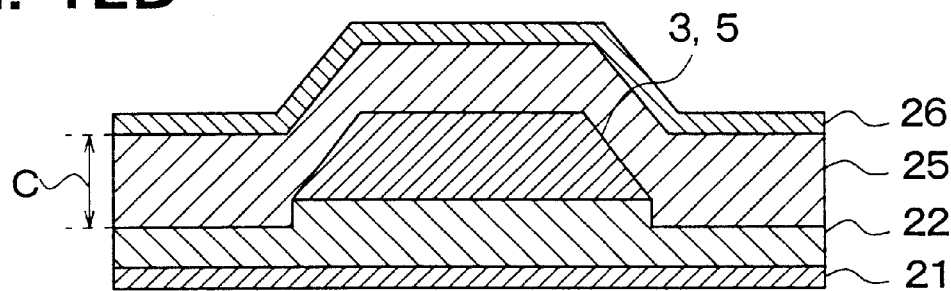
Figure 13:
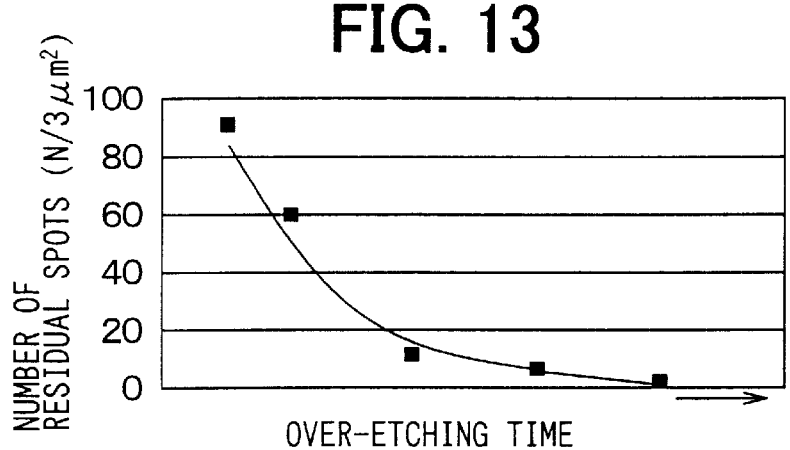
FIG. 13 is a graph showing a relation between an over-etching time and the number of residual spots on a first insulating layer.

The layers constituting the membrane structure 10 shown in FIG. 12A are formed in the same manner as in the fourth embodiment. The metal layer 23 composed of the Pt-layer and the Ti-layer is etched into the form of metal stripes 3, 5, as shown in FIG. 12B. In this embodiment, the etching ion is incident upon the metal layer 23 in the normal line direction, i.e., in a vertical direction. Residual spots 22a reflecting metal grains of the Ti-layer are formed on the surface of the first insulating layer 22, as shown in FIG. 12B. To remove the residual spots 22a, an additional etching is performed from the vertical direction, thereby over-etching the first insulating layer 22 by an amount of "A", as shown in FIG. 12C.

Then, the second insulating layer 25 and the top insulating layer 26 are formed in the same manner as in the fourth embodiment.

The proper amount "A" of the over-etching will be described below, referring also to FIG. 13. FIG. 13 shows a relation between an over-etching time and the number of residual spots 22a. As seen in FIG. 13, the number of the residual spots 22a is reduced as the ever-etching time becomes longer. The thickness "B" of the metal stripes 3, 5 is 280 nm in this embodiment (B=280 nm). When the surface of the first insulating layer 22 is over-etched in an amount of 30% of the metal layer thickness (A=about 80 nm), the number of residual spots 22a is reduced to a number which does not adversely affect the strength of the membrane structure 10. Accordingly, the minimum amount of over-etching "A" can be set to 30% of the metal layer thickness "B".

An upper limit of the amount of over-etching is determined by the thickness "C" of the second insulating layer 25 and the metal layer thickness "B". That is, the maximum amount of over-etching "A" has to be smaller than ("C"-"B"). If "A" exceeds ("C"-"B"), the second insulating layer 25 cannot properly cover the metal stripes 3, 5. The amount of over-etching cannot exceed the thickness of the first insulating layer 22. As a result, "A" is set to a level larger than 30% of "B" and smaller than ("C"-"B").

Since the surface of the first insulating layer 22 on which residual spots 22a remain is over-etched by the additional etching to properly remove the residual sports, the second insulating layer 25 can be formed without developing the harmful cracks therein. Accordingly, the strength of the membrane structure 10 is secured.

The fifth embodiment described above may be somewhat modified. That is, though the ion-incident direction in the etching process of the metal layer 23 is set to the direction parallel to the normal line of the metal layer 23, the ion-incident direction may not be limited to that direction, but it may be arbitrarily chosen. Further, the ion-incident direction in the over-etching process of the first insulating layer 22 may be set to the angle at which the etching rate of the first insulating layer 22 is high.

As shown in FIG. 11, the etching rate of silicon dioxide, of which the first insulating layer 22 is made, is sufficiently high at the ion-incident angle larger than 30 degrees. Therefore, it is preferable to perform the over-etching for removing the residual spots 22a on the first insulating layer 22, using the ion-incident angle larger than 30 degrees. The amount of over-etching "A" is set to the same range as in the fifth embodiment, i.e., ("C"-"B")>"A">(30% of "B").

As the etching for removing the residual spots 22a, an isotropic etching method may be used. It is possible to make the etched surface of the first insulating layer 22 smoother by the isotropic etching. For example, wet-etching using hydrofluoric acid or dry-etching using $CF_4$ gas may be performed. The amount of over-etching "A" is set in the same range as above in the isotropic etching, too.

The heat-treatment process for enlarging the metal grains in the metal layer 23 composed of the Pt-layer and the Ti-contact layer may be performed at a time different from that in the fourth and fifth embodiments. That is, the metal layer 23 is formed on the first insulating layer 22, then the metal layer 23 is etched into the metal stripes 3, 5, and then the second insulating layer 25 is formed to cover the metal stripes 3, 5. After the second insulating layer 25 is formed, the heat-treatment is performed. Since the metal layer 23 is etched by ion-milling before the heat-treatment, formation of the residual spots 22a on the surface of the first insulating layer 22 is suppressed.

Further, it is possible to use a metallic material other than titanium (Ti) to form the contact layer underneath the platinum layer. The etching rate of Ti is different from that of Pt, and Ti disperses into the Pt-layer and condenses therein in the heat-treatment process, though the Ti-layer functions as a good contact layer between the silicon dioxide layer and the Pt-layer. Those properties of Ti tend to cause an uneven etching of the metal layer 23 and to form residual spots 22a on the first insulating layer 22. To alleviate this problem, Ti may be replaced with another metal such as aluminum (Al) that forms a good contact with silicon dioxide and has an etching rate substantially equal to that of Pt. Generally, such a metal that does not disperse and condense in the Pt-layer and forms a good contact with the silicon dioxide layer may be used as a material forming the contact layer.

Figure 14:
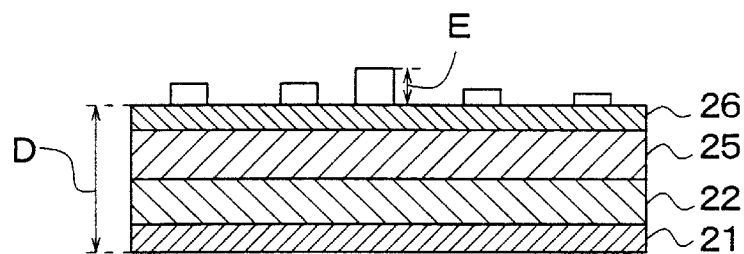
FIG. 14 is a cross-sectional view of laminated layers in a membrane structure, showing projections formed on its surface.
Figure 15:
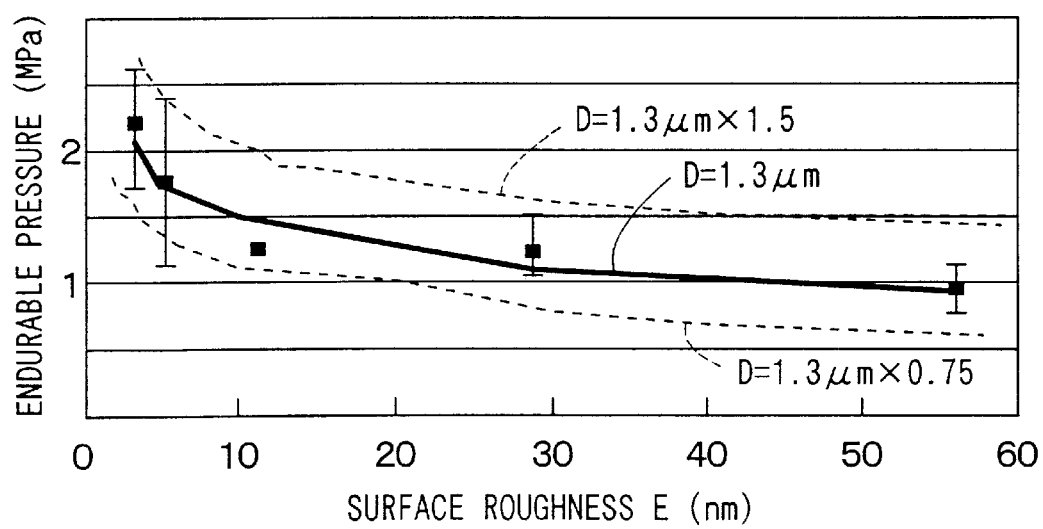
FIG. 15 is a graph showing a relation between a surface roughness of a membrane structure and a mechanical pressure which the membrane structure is able to withstand.
Figure 16A:
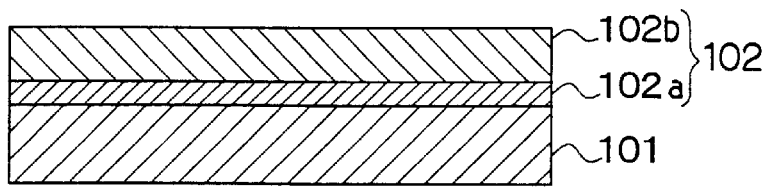
FIGS. 16A–16D are cross-sectional views of a membrane structure of a sensor, showing its conventional manufacturing method.
Figure 16B:
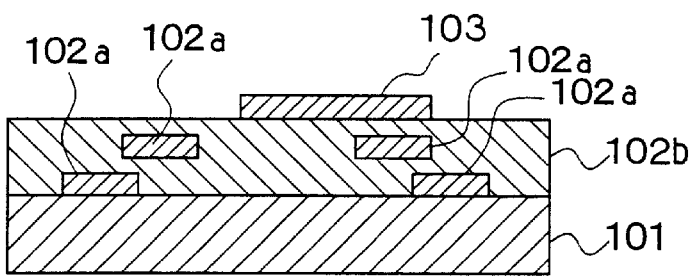
Figure 16C:
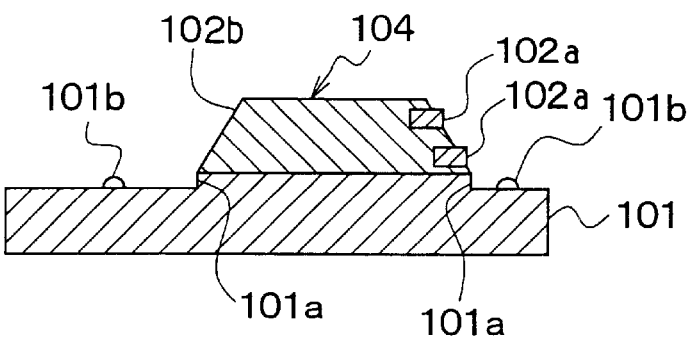
Figure 16D:
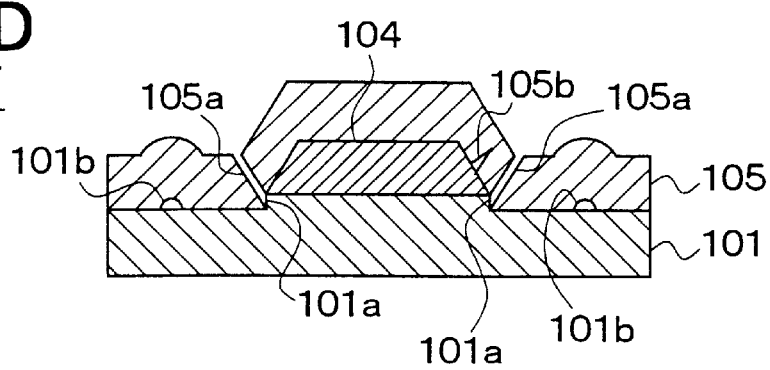

A sixth embodiment of the present invention will be described with reference to FIGS. 14 and 15. FIG. 14 shows a part of the membrane structure 10, where no metal layer 23 is formed. A total thickness D of all the layers 21, 22, 25, 26, and a surface roughness E (a height of the highest projection) of the combined layers are schematically shown in FIG. 14. FIG. 15 shows a mechanical pressure that the membrane structure 10 is able to endure (endurable pressure) in relation to the surface roughness E. A solid line in FIG. 15 shows the endurable pressure of the membrane structure 10 wherein the total thickness D is 1.3 $\mu$m (D=1.3 $\mu$m), an upper line shows the same wherein D=1.3 $\mu$m×1.5, and a lower line shows the same wherein D=1.3 $\mu$m×0.75.

The endurable pressure depends on the total thickness D and the surface roughness E. When the total thickness D is 1.3 $\mu$m, the membrane structure 10 shows a sufficiently high endurable pressure, if the surface roughness E is less than 50 nm. When the total thickness D is 1.3 $\mu$m×0.75, the endurable pressure is sufficiently high, if the surface roughness E is less than 20 nm. Generally, the endurable pressure that is sufficiently high in a practical use is secured if the surface roughness E does not exceed 10% of the total thickness D. It is further preferable to control the surface roughness E within 4% of the total thickness D. It is also preferable to control a surface roughness of each layer (21, 22, 25, 26) within 10% of a thickness of each layer.

The present invention is applicable to a membrane structure of other sensors, such as an infrared sensor, a humidity sensor, a gas sensor, or the like. Further, the membrane structure may be formed to include a thin film bridge circuit.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a sensor having a membrane structure that includes a first insulating layer, metal stripes formed on the first insulating layer and a second insulating layer covering the metal stripes, the method comprising steps of:

forming a metal layer on the first insulating layer;

heat-treating the metal layer to enlarge a metal grain size in the metal layer;

etching the heat-treated metal layer to form the metal stripes; and forming the second insulating layer to cover the metal stripes.

2. The method of manufacturing a sensor as in claim 1, wherein:

the etching step is performed to make a taper angle made between a surface of the first insulating layer and an end surface of the metal stripe smaller than 65 degrees.

3. The method of manufacturing a sensor as in claim 2, wherein:

the etching step includes a step of forming a resist layer having a thickness of less than 1.3 $\mu$m on the metal layer and a step of post-baking the resist layer at a temperature higher than 140° C. and lower than 180° C.; and the metal layer is etched under a dry-etching process, using the post-baked resist-layer as an etching mask.

4. The method of manufacturing a sensor as in claim 1, wherein:

in the step of forming the second insulating layer, the second insulating layer is so formed that its thickness is thicker than a thickness of the metal stripes.

5. The method of manufacturing a sensor as in claim 1, wherein:

the metal layer is made of platinum; and the platinum metal layer is etched by ion-milling using argon gas.

6. The method of manufacturing a sensor as in claim 1, wherein:

the metal layer is heat-treated at a temperature higher than 300° C.

7. The method of manufacturing a sensor as in claim 1, wherein:

the method further includes a step of forming an etching-stopper metal layer made of a metal having an etching rate lower than that of the metal layer on the first insulating layer; and the metal layer is formed on the etching-stopper metal layer.

8. The method of manufacturing a sensor as in claim 7, wherein:

the etching-stopper metal layer is made of titanium.

9. The method of manufacturing a sensor as in claim 1, wherein:

the sensor having the membrane structure is used as a heat-responsive airflow sensor.

10. A method of manufacturing a sensor having a membrane structure that includes a first insulating layer, a second insulating layer, and metal stripes disposed between the first insulating layer and the second insulating layer, the metal stripes being composed of two kinds of metals, the method comprising:

forming a metal layer composed of a first metal layer and a second metal layer, the first metal layer being formed in contact with the first insulating layer and the second metal layer being formed on the first metal layer;

heat-treating the metal layer to enlarge a metal grain size in the metal layer;

etching the metal layer to form the metal stripes, so that the first and the second metal layers are etched at a substantially equal etching rate; and forming the second insulating layer to cover the metal stripes.

11. The method of manufacturing a sensor as in claim 10, wherein:

the first metal layer is made of titanium, and the second metal layer is made of platinum; and the metal layer is etched under an ion-milling method in which an ion-incident angle is set in a range of 20–60 degrees.

12. The method of manufacturing a sensor as in claim 10, wherein:

the metal layer is etched under an ion-milling method in which an ion-incident angle is slanted from a normal line of the metal layer.

13. The method of manufacturing a sensor as in claim 12, wherein:

the ion-incident angle is set in a range of 20–60 degrees.

14. The method of manufacturing a sensor as in claim 12, wherein:

the metal layer is rotated around its normal line during the metal layer is being etched.

15. The method of manufacturing a sensor as in claim 10, wherein:

the etching step includes a step of forming a resist layer on the metal layer, the resist layer having end surfaces tapered relative to an upper surface of the metal layer; and the metal layer is etched, using the resist layer as an etching mask.

16. The method of manufacturing a sensor as in claim 10, wherein:

the etching step includes a step of additionally etching a surface of the first insulating layer for removing residual spots formed thereon in the etching step of the metal layer; and the surface of the first insulating layer is etched in an amount larger than 30% of a thickness of the metal layer.

17. The method of manufacturing a sensor as in claim 16, wherein:

the surface of the first insulating layer is etched in an amount less than an amount obtained by subtracting a thickness of the metal layer from a thickness of the second insulating layer.

18. The method of manufacturing a sensor as in claim 16, wherein:

the etching step including the additional etching step is performed under an ion-milling method, in which etching ions are incident upon the metal layer and the first insulating layer in a direction substantially parallel to a normal line of both layers; and the first insulating layer is over-etched by the additional etching.

19. The method of manufacturing a sensor as in claim 16, wherein:

the additional etching step is performed under an ion-milling method, in which an ion-incident angle is set to an angle that is able to etch the first insulating layer at a high etching rate.

20. The method of manufacturing a sensor as in claim 16, wherein:

the additional etching step is performed under an isotropic etching method.

21. The method of manufacturing a sensor as in claim 10, wherein:

the step of heat-treating the metal layer is performed after the second insulating layer is formed.

22. The method of manufacturing a sensor as in claim 10, wherein:

the step of etching the metal layer is performed under an ion-milling method; and the second metal layer is made of platinum, and the first metal layer is made of a metal which has an etching rate substantially equal to that of platinum and makes a good contact with the first insulating layer.

23. The method of manufacturing a sensor as in claim 10, wherein:

the step of etching the metal layer is performed under an ion-milling method; and the second metal layer is made of platinum, and the first metal layer is made of a metal which does not disperse and condense in the second metal-layer in the heat-treatment step and makes a good contact with the first insulating layer.

24. The method of manufacturing a sensor as in claim 10, wherein:

a surface roughness of a part of the membrane structure where the metal stripes are not included is made smaller than 10% of a total thickness of layers constituting that part of the membrane structure.

25. The method of manufacturing a sensor as in claim 10, wherein:

a surface roughness of each layer constituting the membrane structure is made smaller than 10% of a thickness of a respective layer.

* * * * *